(12) United States Patent
Wang et al.

(10) Patent No.: US 8,093,933 B2
(45) Date of Patent: Jan. 10, 2012

(54) METHOD OF FAST TRACKING AND JITTER IMPROVEMENT IN ASYNCHRONOUS SAMPLE RATE CONVERSION

(75) Inventors: Yong Wang, Suzhou (CN); Odi Dahan, Oranit (IL); Zheng Wu, Suzhou (CN); Jianbin Zhao, Shanghai (CN)

(73) Assignee: Freescale Semiconductor, Inc., Austin, TX (US)

(*) Notice: Subject to any disclaimer, the term of this patent is extended or adjusted under 35 U.S.C. 154(b) by 326 days.

(21) Appl. No.: 12/606,195

(22) Filed: Oct. 27, 2009

(65) Prior Publication Data

US 2010/0271091 A1    Oct. 28, 2010

(30) Foreign Application Priority Data

Dec. 5, 2008 (CN) .......................... 2008 1 0179793

(51) Int. Cl.
*H03L 7/00* (2006.01)
*G06F 17/17* (2006.01)
(52) U.S. Cl. ........ 327/150; 327/151; 327/159; 327/160; 375/374; 708/313
(58) Field of Classification Search .................. 327/147, 327/150, 151, 156, 159, 160; 375/373–376; 708/313
See application file for complete search history.

(56) References Cited

U.S. PATENT DOCUMENTS

| | | | |
|---|---|---|---|
| 6,141,671 A * | 10/2000 | Adams et al. .................. | 708/313 |
| 6,900,675 B2 * | 5/2005 | Briones ......................... | 327/147 |
| 7,233,636 B2 | 6/2007 | Castlebary et al. | |
| 7,327,302 B2 | 2/2008 | Westlund et al. | |
| 7,345,600 B1 | 3/2008 | Fedigan | |
| 7,415,493 B2 * | 8/2008 | Dahan ........................... | 708/313 |
| 7,450,601 B2 | 11/2008 | Sundqvist et al. | |

* cited by examiner

*Primary Examiner* — Patrick O'Neill
(74) *Attorney, Agent, or Firm* — Charles Bergere

(57) ABSTRACT

A method for fast tracking and jitter improvement in an asynchronous sample rate conversion includes a digital phase locked loop (DPLL) for an asynchronous sample rate conversion (ASRC) device. A control apparatus in the DPLL includes a gain controller that sets and maintains gains ($K_i$, $K_p$) of two branches of the control apparatus at a fixed value, which enables searching of a desired value by the DPLL to determine a neighborhood of the desired value, and reduces the gains when the number of samples reaches a predetermined number. Processing units in the DPLL generate and process first and second input signals based on an input clock, an output clock, and a system clock. The second input signal is processed using two branches. Signals resulting from the two branches are re-aligned according to a changed status of the first processed input signal such that the signals resulting from the two branches are sampled in the same input clock interval.

18 Claims, 7 Drawing Sheets

METHOD OF FAST TRACKING AND JITTER IMPROVEMENT IN ASYNCHRONOUS SAMPLE RATE CONVERSION

BACKGROUND OF THE INVENTION

The present invention relates, in general, to an asynchronous sample rate converter, and more particularly, to a method for fast tracking and jitter improvement in an asynchronous sample rate converter.

In some particular applications of digital signal processing, there is a need to change a sampling rate of a signal, either increasing it or decreasing it. For example, in telecommunication systems that transmit and receive different types of signals (e.g., facsimile, speech, video), various signals must be processed at different rates depending on corresponding bandwidths. The process of converting a signal from a given rate to a different rate is called sample rate conversion. In some applications where the input and output samples are controlled by independent clocks, this process is known as asynchronous sample rate conversion. An overview of sample rate conversion techniques can be found in "Digital Signal Processing" by J. Proakis and D. Manolakis (third edition, Prentice Hall, 1996).

For example, with respect to some applications, there is a requirement to include a module called an "asynchronous sample rate conversion (ASRC)" in a processor such as a digital signal processor (DSP). This module is used, for example, to convert an audio data stream from one sampling rate to another sampling rate. The ASRC module is characterized mainly by a response time, and Signal-to-Noise-Distortion-Ratio (SNDR) after conversion.

One important element influencing the final ASRC SNDR performance is the ratio $Fs_{in}/Fs_{out}$ between the input sampling rate $Fs_{in}$ and the output sampling rate $Fs_{out}$, where a fast convergence time and low jitter are desirable. Slow convergence can cause buffer under-run or over-run, and jitter can degrade the final SNDR performance.

Patent document WO2003/081774A1 discloses a digital phase locked loop (DPLL) for an asynchronous sample rate conversion. This DPLL can track the ratio $Fs_{in}/Fs_{out}$.

FIG. 1 is a schematic block diagram of a conventional asynchronous sample rate conversion (ASRC) digital phase locked loop (DPLL). As shown in FIG. 1, the conventional ASRC DPLL includes two branches, i.e., an input counter 101 and a system counter 104, which respectively perform first and second processing.

A first processing unit, which performs the first processing, includes: an input counter 101 that performs a control based on an input clock; a first latch 102 that has an input receiving an output of the input counter 101, performs a control based on an output clock, latches a first input signal when the output clock is asserted, and outputs a first processed input signal.

A second processing unit, which performs the second processing, includes: a system counter 104 that performs a control based on a DSP system clock and is reset by an input clock; a second latch 109, similar to the first latch 102, that has an input receiving an output of the system counter 104, performs a control based on an output clock, and latches a second input signal when the output clock is asserted; a third latch 105 that has an input receiving the output of the system counter 104 and performs a control based on an input clock; a fourth clock 106 that has an input receiving an output of the third latch 105, performs a control based on an output clock, and latches the input signal when the output clock is asserted; and a division module 107 that receives an output signal x of the second latch 109 and an output signal y of the forth latch 106 and performs a division of the two output signals to thereby output a second processed input signal.

The first processed input signal and the second processed input signal are summed in a first summer 103, and the summed signal, i.e., a summed input signal C, is output to a subtractor 108. In the subtractor 108, a feedback signal is subtracted (the generation of the feedback signal will be described later) from the summed input signal C, thereby obtaining a predicted input signal (i.e., error signal) E.

The output of the subtractor, i.e., the predicted input signal (error signal) E, is input to two gain amplifiers 113 and 114, respectively. The amplified gain of the first gain amplifier 113 is $K_i$, and the amplified gain of the second gain 114 amplifier is $K_p$. According to the predicted input signal, a gain controller 115 controls the two gain amplifiers 113 and 114, respectively.

The predicted input signal E enters a first integrator 111 after being amplified by the gain amplifier 113 and a first integrated signal is output from the first integrator 111. The predicted input signal E and the first integrated signal are summed in a second summer 110 after the predicted input signal E is amplified by the gain amplifier 114 and a summed amplified signal R is generated from the second summer 110. The summed amplified signal R is output via a second integrator 112 as an integer part $n_0$ and a fractional part f. The second integrator 112 is controlled under the output clock, and an output of the second integrator returns to the subtractor 108 as the mentioned feedback signal. Recall that the predicted input signal (error signal) E is obtained by subtracting said feedback signal from the summed input signal C.

However, if the implementation disclosed in this patent document is used, when the input sampling rate is very near the output sampling rate, the SNDR performance is only low at 90 dB, and it cannot reach 120 dB as desired. More particularly, it can be seen from FIG. 1 that the input data for the DPLL are derived from the input counter 101 and the system counter 104 and pass through latches 102, 109, and 106. However, the outputs from the latches 109 and 106 are not from the same input clock interval. As the counters 101 and 104 are quantized elements, a quantized error needs to be carefully dealt with. From the real-time implementation, misalignment in time of the output from the latches 109 and 106 can amplify the quantization error, and causes great jitter to the input of DPLL, which reduces the SNDR performance.

DETAILED DESCRIPTION OF EMBODIMENTS OF THE INVENTION

Figure 1:
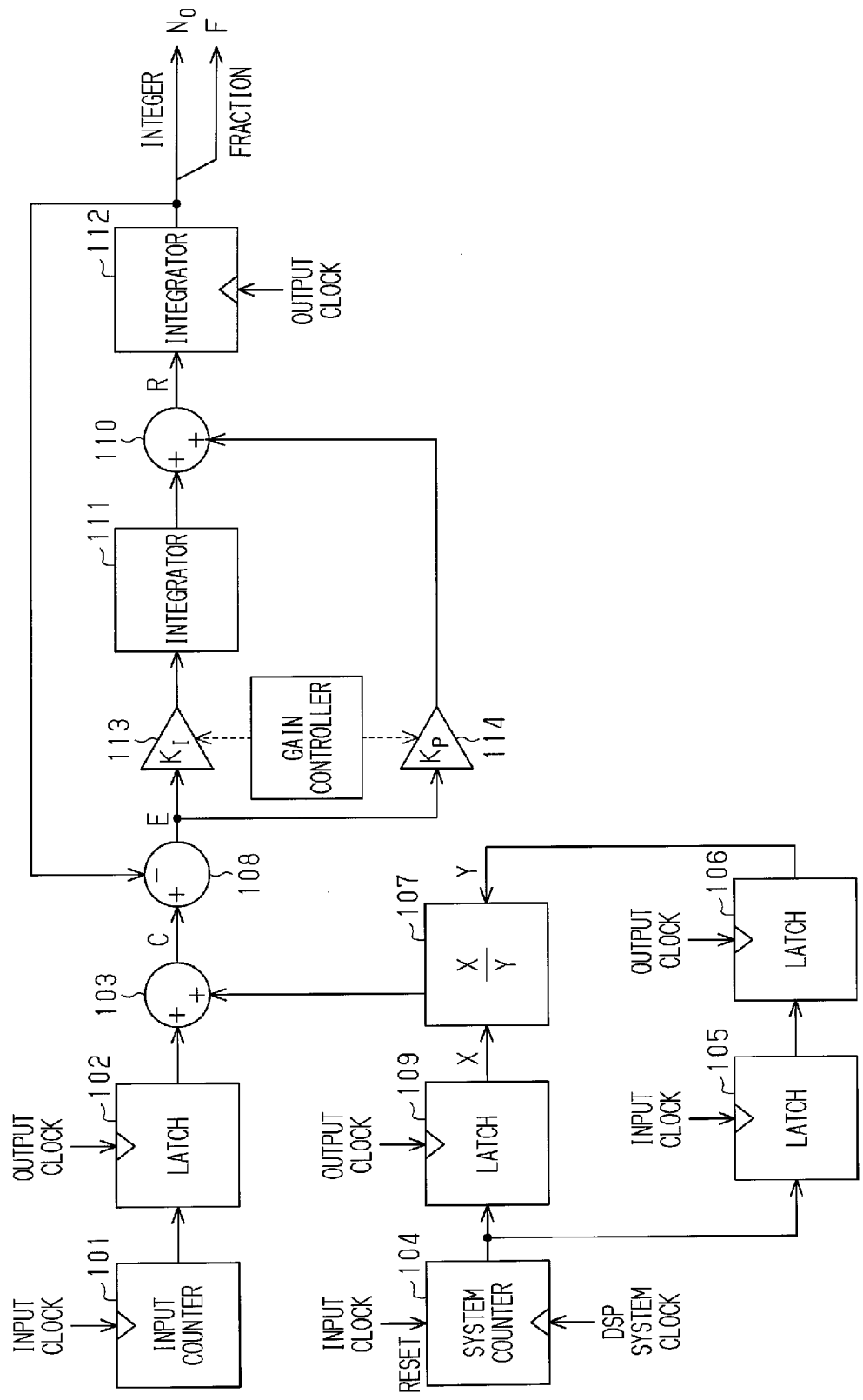
FIG. 1 is a schematic block diagram of a conventional asynchronous sample rate conversion (ASRC) digital phase locked loop (DPLL)

The characteristics and advantages of the present invention are described below in combination with the embodiments. In order to solve the above problem, the present invention provides a method for fast tracking and jitter improvement in an asynchronous sample rate conversion.

The present invention provides a fast searching scheme for the convergence performed by a DPLL, and a data alignment method to reduce the jitter. Jitter is reduced by re-aligning the data, and an error in ratio estimation is reduced, thus the final SNDR performance is improved as compared with the conventional DPLL.

During a search period, special parameters are used to speedup a DPLL convergence time. In a first aspect of the present invention, a control apparatus in a digital phase locked loop (DPLL) is provided. The control apparatus includes: a counter that counts a number of samples; and a gain controller, in communication with the counter, that sets and maintains gains of two branches of the control apparatus at a fixed value, which enables searching of a desired value by the DPLL to determine a neighborhood of the desired value, and reduces the gains when the number of samples counted in the counter reaches a predetermined number.

In one embodiment, the control apparatus further comprises: a subtractor that subtracts a feedback signal from an input signal to generate a predicted input signal; a first gain amplifier that amplifies the predicted input signal with a first gain to generate a first amplified signal; a second gain amplifier that amplifies the predicted input signal with a second gain to generate a second amplified signal; a first integrator, connected to the first gain amplifier, that integrates the first amplified signal to generate a first integrated signal; a summer, connected to the first integrator and the second gain amplifier, that sums the first integrated signal and the second amplified signal to generate a summed signal; and a second integrator, connected to the summer, that integrates the summed signal when an output clock is asserted and generates the feedback signal; wherein the gain controller determines whether an absolute value of the predicted input signal is larger than a predetermined threshold in order to set the first gain and the second gain at the fixed value if the absolute value of the predicted input signal is larger than the predetermined threshold, to maintain the first and the second gains at the fixed value to enable the DPLL searching to locate the neighborhood of the desired value, and to reduce the first and the second gains when the number of samples counted in the counter reaches the predetermined number.

In an embodiment of the invention, the fixed value of the gains is 1 and the predetermined number of samples is at least 4 samples.

According to a second aspect of the present invention, a digital phase locked loop (DPLL) for an asynchronous sample rate conversion (ASRC) device is provided, the DPLL comprising: a first processing unit that generates and processes a first input signal to produce a first processed input signal based on an input clock and an output clock; a second processing unit that processes and generates a second input signal to produce a second processed input signal based on the input clock, the output clock, and a system clock; a first summer, connected to the first and second processing units, that sums the first and second processed input signals to produce a summed input signal; and a closed loop control unit connected to the first summer, wherein the closed loop control unit comprises a counter that counts a number of samples and a gain controller that sets and maintains gains of two branches of the closed loop control unit at a fixed value to enable searching by the DPLL to locate a neighborhood of a desired value, and reduces the gains of the two branches when the counted number of samples reaches a predetermined number.

Preferably, the DPLL further comprises: a subtractor, connected to the first summer, that subtracts a feedback signal from the summed input signal to generate a predicted input signal; the closed loop control unit further comprises: a first gain amplifier, connected to the subtractor, that amplifies the predicted input signal with a first gain to generate a first amplified signal; a second gain amplifier, connected to the subtractor, that amplifies the predicted input signal with a second gain to generate a second amplified signal; a first integrator, connected to the first gain amplifier, that integrates the first amplified signal to generate a first integrated signal; a second summer, connected to the first integrator and the second gain amplifier, that sums the first integrated signal and the second amplified signal to produce a summed amplified signal; wherein the gain controller determines whether an absolute value of the predicted input signal is larger than a predetermined threshold, sets the first and second gains at the fixed value if it is determined that the absolute value of the predicted input signal is larger than the predetermined threshold, maintains the first and second gains at the fixed value to enable the DPLL searching to locate the neighborhood of the desired value, and reduces the first and the second gains when the number of samples counted in the counter reaches the predetermined number, and the DPLL further comprises a second integrator, connected to the second summer, that integrates the summed amplified signal when the output clock is asserted to generate the feedback signal.

Preferably, the second input signal is processed in two branches of the second processing unit, and signals resulting from the two branches are re-aligned according to a changed status of the first processed input signal before producing the second processed input signal such that the signals resulting from the two branches are sampled in the same input clock interval.

In one embodiment, the first processing unit comprises: a first latch that latches the first input signal based on the input clock when the output clock is asserted, and the second processing unit comprises: a second latch that latches the second input signal based on the input clock and the system clock when the output clock is asserted; a third latch that latches the second input signal when an output enabled (OEN) signal is asserted or the input and an output clock rising edges occur in a master clock interval; a fourth latch that latches an output signal of the third latch when the output clock is asserted; means for re-aligning an output signal of the second latch with an output signal of the fourth latch according to the changed status of an output signal of the first latch, such that the output signal of the second latch and the output signal of the fourth latch are sampled in the same input clock interval; and means for performing a division with respect to the re-aligned output signals from the second latch and the fourth latch and outputting the second processed input signal.

In one embodiment, the second processing unit further comprises a fifth latch that generates the OEN signal, wherein the OEN signal is asserted when the output clock is asserted and no rising edge of the input clock occurs at the master clock interval.

According to a third aspect of the present invention, a digital phase locked loop (DPLL) for an asynchronous sample rate conversion (ASRC) device is provided, the DPLL comprising: a first processing unit that processes and generates a first input signal to produce a first processed input signal based on an input clock and an output clock; a second processing unit that processes and generates a second input signal to produce a second processed input signal based on the input clock, the output clock, and a system clock, wherein the second processing unit includes two branches for processing the second input signal, and signals resulting from the two branches are re-aligned according to a changed status of the first processed input signal before producing the second processed input signal such that the signals resulting from the two branches are sampled in the same input clock interval; a first summer, connected to the first and second processing units, that sums the first and second processed input signals to produce a summed input signal; and a closed loop control unit having an input including the difference between the summed input signal and a feedback signal generated by the closed loop control unit.

Preferably, the closed loop control unit comprises: a counter that counts a number of samples; and a gain controller that sets and maintains gains of the two branches of the second processing unit at a fixed value to enable the DPLL searching to locate the neighborhood of a desired value, and reduces the gains when the number of samples counted in the counter reaches a predetermined number.

Preferably, the DPLL further comprises: a subtractor, connected to the first summer, that subtracts a feedback signal from the summed input signal to generate a predicted input signal; the closed loop control unit further comprises: a first gain amplifier, connected to the subtractor, that amplifies the predicted input signal with a first gain to generate a first amplified signal; a second gain amplifier, connected to the subtractor, that amplifies the predicted input signal with a second gain to generate a second amplified signal; a first integrator, connected to the first gain amplifier, that integrates the first amplified signal to generate a first integrated signal; a second summer, connected to the first integrator and the second gain amplifier, that sums the first integrated signal and the second amplified signal to produce a summed amplified signal; wherein the gain controller determines whether an absolute value of the predicted input signal is larger than a predetermined threshold, sets the first and second gains at the fixed value if it is determined that the absolute value of the predicted input signal is larger than the predetermined threshold, maintains the first and second gains at the fixed value to enable the DPLL searching to the neighborhood of the desired value, and reduces the first and the second gains when the number of samples counted in the counter reaches the predetermined number, and the DPLL further comprises a second integrator, connected to the second summer, that integrates the summed amplified signal when the output clock is asserted to generate the feedback signal.

Preferably, the first processing unit comprises: a first latch that latches the first input signal based on the input clock when the output clock is asserted, and the second processing unit comprises: a second latch that latches the second input signal based on the input clock and the system clock when the output clock is asserted; a third latch that latches the second input signal when an output enabled (OEN) signal is asserted or the input and an output clock rising edges occur in a master clock interval; a fourth latch that latches an output signal of the third latch when the output clock is asserted; means for re-aligning an output signal of the second latch with an output signal of the fourth latch according to the changed status of an output signal of the first latch, such that the output signal of the second latch and the output signal of the fourth latch are sampled in the same input clock interval; and means for performing a division with respect to the re-aligned output signals from the second latch and the fourth latch and outputting the second processed input signal.

Preferably, the second processing unit further comprises a fifth latch that generates the OEN signal, wherein the OEN signal is asserted when the output clock is asserted if no rising edge of the input clock occurs at the master clock interval.

According to the above technical solutions, in the present invention, a modified DPLL structure is provided, and a data re-alignment scheme is proposed as the pre-processing part of the DPLL. In this manner, jitter is reduced, and an almost jitter free estimation of the ratio $Fs_{in}/Fs_{out}$ is obtained. The system SNDR can reach 120 dB and even greater.

In addition, in the present invention, a fast searching scheme based on the information provided by the pre-processing stage is provided. With this fast searching scheme, a second order DPLL can fast search to the neighborhood of the exact value of $Fs_{in}/Fs_{out}$ in almost only 4 samples. That is to say, the technical effects achieved by the present invention include: when the input sampling rate is very near the output sampling rate, by using data re-alignment, the data samples can be re-aligned with a correct timing order, thereby reducing the influence of the quantization error, the jitter is reduced, and the performance is greatly improved. The SNDR reaches 120 dB. The error signal is used to restart the DPLL and activate the fast searching scheme, and the DPLL can fast search to the neighborhood of the exact value.

Figure 2:
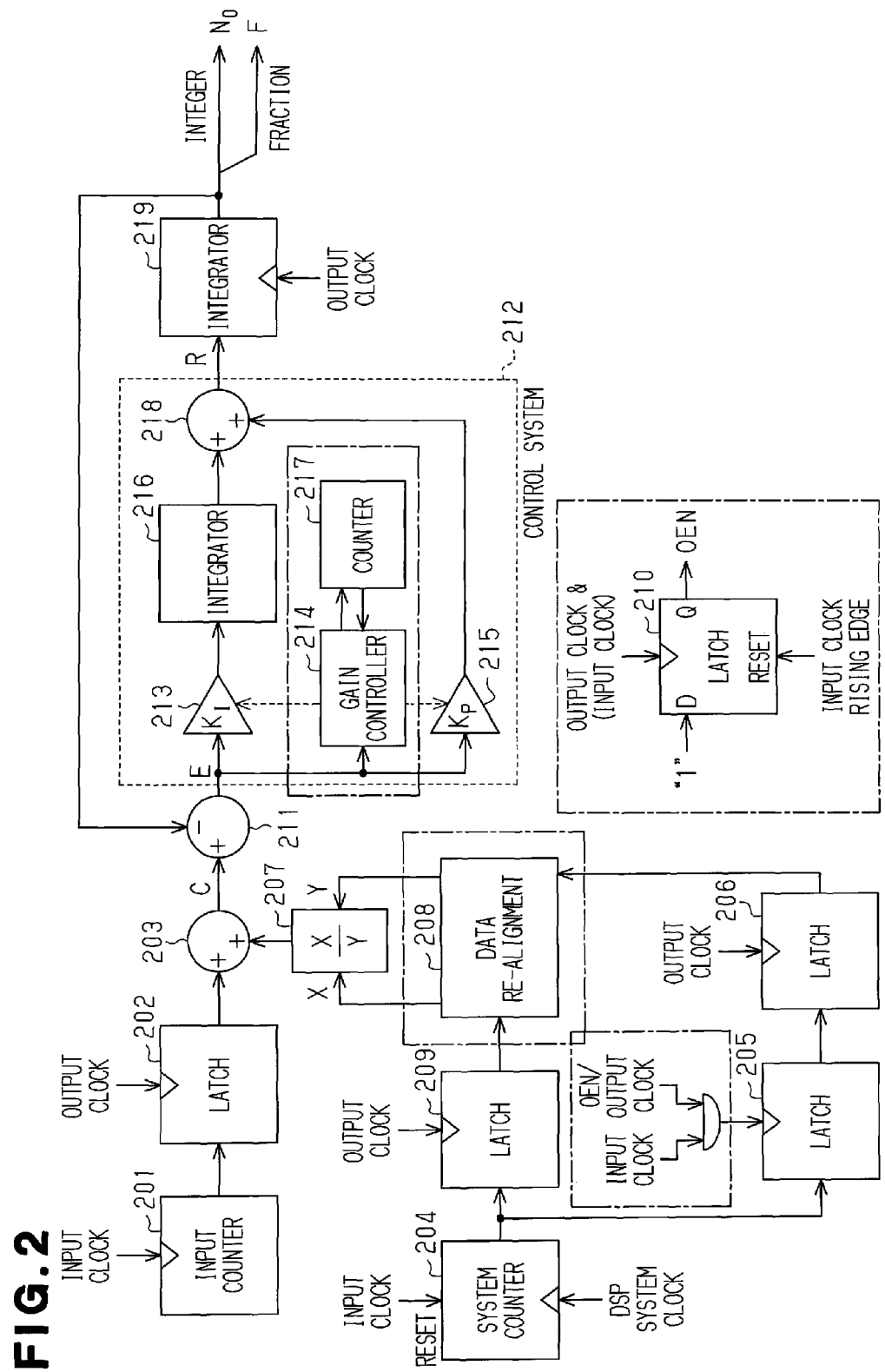
FIG. 2 is a schematic block diagram of an ASRC DPLL in accordance with an embodiment of the present invention.

FIG. 2 is a schematic block diagram of an ASRC DPLL according to an embodiment of the present invention. As shown in FIG. 2, the ASRC DPLL according to the present invention includes two branches, an input counter 201 and a system counter 204, which respectively perform a first processing and a second processing.

A first processing unit performing the first processing includes: an input counter 201 that performs a control based on an input clock; a first latch 202 that has an input receiving an output of the input counter 201, performs a control based on an output clock, latches a first input signal when the output clock is asserted, and outputs a first processed input signal.

A second processing unit performing the second processing includes: a system counter 204 that performs a control based on a DSP system clock and is reset by an input clock; a second latch 209, similar to the first latch 202, that has an input receiving an output of the system counter 204, performs a control based on an output clock, and latches a second input signal when the output clock is asserted; a third latch 205 that has an input receiving the output of the system counter 204, the third latch 205 in FIG. 2 being different from the third latch 105 in FIG. 1 in that it not only performs a control based on an input clock, but also performs a control based on an output enabled (OEN) signal and an output signal; a fourth clock 206 that has an input receiving an output of the third latch 205, performs a control based on an output clock, and latches the input signal when the output clock is asserted; a data re-alignment module 208 that receives the output signal of the second latch 209 and the output signal of the fourth latch 206, in which module, the output signal of the second latch 209 and the output signal of the fourth latch 206 are re-aligned according to a changed status of the output signal of the first latch 202 such that the output signal of the second latch 209 and the output signal of the fourth latch 206 are sampled in the same input clock interval; and a division module 207 that receives signals x and y that are the re-aligned output signal of the second latch 209 and the realigned output signal of the forth latch 206 and performs a division of the two realigned output signals to thereby output a second processed input signal.

The first processed input signal and the second processed input signal are summed in a first summer 203, and the summed signal, i.e., a summed input signal C, is output to a subtractor 211. In the subtractor 211, a feedback signal is subtracted (the generation of the feedback signal will be described later) from the summed input signal C, thereby obtaining an input of a closed loop control unit 212, that is, predicted input signal (i.e., error signal) E.

The closed loop control unit 212 includes a first gain amplifier 213 and a second gain amplifier 215. The output of the subtractor 211, i.e., predicted input signal (error signal) E, is respectively output to the above two gain amplifiers as the input of the closed loop control unit 212. The amplified gain of the first gain amplifier 213 is $K_i$, and the amplified gain of the second gain 215 amplifier is $K_p$. According to the predicted input signal E, a gain controller 214 controls the two gain amplifiers 213 and 215, respectively, and sets and maintains the two gains $K_i$ and $K_p$ at a fixed value, which enables the DPLL searching to locate a neighborhood of a desired value. The closed loop control unit 212 further includes a counter 217 that counts a number of samples. The gain controller 214 reduces the gains $K_i$ and $K_p$ of the two gain amplifiers 213 and 215 when the number of samples reaches a predetermined number.

The predicted input signal E enters a first integrator 216 after amplified by the gain amplifier 213 and a first integrated signal is output from the first integrator 216. The predicted input signal and the first integrated signal are summed in a second summer 218 after the predicted input signal is amplified by the gain amplifier 215, and a summed amplified signal R, i.e., an output of the closed loop control unit 212, is generate from the second summer 218.

The summed amplified signal R is output via a second integrator 219 as an integer part $n_0$ and a fractional part f. The second integrator 219 is controlled under the output clock, and an output of the second integrator 219 returns to the subtractor 211 as the mentioned feedback signal Recall that the input of the closed loop control unit 212, i.e., the predicted input signal (error signal) E, is obtained by subtracting said feedback signal from the summed input signal C.

As discussed above, in the conventional DPLL shown in FIG. 1, the input data are derived from the input counter 101 and the system counter 104 and pass through latches 102, 109, 106. The outputs from the latches 109 & 106 are not from the same input clock interval. As the counters 101 and 104 are quantized elements, a quantized error needs to be carefully dealt with. From the real-time implementation, misalignment in time of the output from the latches 109 and 106 can amplify the quantization error, and causes great jitter to the input of DPLL, which reduces the SNDR performance.

The data re-alignment module 208 is added to FIG. 2. In order to complete the operation of the data re-alignment, an additional logic is required. FIG. 2 shows such an additional logic. The third latch 205 not only performs a control based on an input clock, but also performs a control based on an output enabled (OEN) signal and an output signal. A fifth latch 210 is used for generating the OEN signal. The input of the fifth latch 210 is "1". A rising edge of the input clock is used for resetting the fifth latch 210, and a logic operation "output clock & (! input clock)" is used for controlling the fifth latch 210 to perform a latching and output the OEN signal. The OEN signal, via a logic operation "OEN|output clock", is input into an AND gate along with the input clock, and the output of the AND gate is used for controlling the third latch 205 to latch the second processed signal and output it to the fourth latch 206.

The steps of the data re-alignment process are as follows:

1) When in a special input clock interval, an output clock event happens, and if no rising edges of the input clock occur in a master clock interval, a signal OEN=1 will be generated by the fifth latch 210 to indicate that this special input clock interval should be latched. This signal OEN is cleared, i.e., reset, after each rising edge of the input clock.

2) When the signal ONE=1 or the rising edges of the input/output clock occur in the same master clock interval, this special input clock interval will be latched by the third latch 205, and later it will appear at the output of the fourth latch 206.

3) Before the division takes place in the division module 207, the output of the second latch 209 is re-aligned with the output of the fourth latch 206 according to a changed status of the output from the first latch 202, and it is guaranteed that they are sampled in the same input clock interval.

4) Division and PLL loop following normal steps are conducted.

It is mentioned above in the step 3) that the output of the second latch 209 is re-aligned with the output of the fourth latch 206 according to a changed status of the output from the first latch 202, and it is guaranteed that they are sampled in the same input clock interval. That is, in the data re-alignment module 208, it is guaranteed that the outputs of the first latch 202, the second latch 209, and the fourth latch 206 are re-aligned. Specially, since the output of the fourth latch 206 is always later than the outputs of the first latch 202 and the second latch 209, the present invention performs the alignment by buffering the outputs of the first latch 202, the second latch 209, and the fourth latch 206 into a buffer (not shown), and then searching the outputs of the first latch 202, the second latch 209, and the fourth latch 206. Such feature of alignment is that when the output of the first latch 202 changes, the output of the fourth latch 206 is a period value of the input clock corresponding to the previous output clock. Those skilled in the art should recognize that the above data re-alignment method and module, including the buffer and the methods and devices for judging the output and judging the alignment mentioned therein, can be achieved by various methods, logics and/or devices known in the art. Accordingly, the present invention does not limit the data re-alignment module 208 is achieved by a specific hardware. The use of such data re-alignment module 208 to achieve the function and technical effect of the present invention is an important innovation of the present invention.

In a fixed-point C code simulation, it is supposed that the input sampling rate is 48000.01123 kHz, and the output sampling rate is 48000 kHz. The simulation results of the system are shown in FIGS. 3-6. In FIGS. 3-6, X axis stands for the sample number, in FIGS. 3, 5A and 5B, Y axis stands for the simulation error from the desired value, and in FIGS. 4 and 6, Y axis stands for the SNDR, in a unit of dB.

Figure 3:
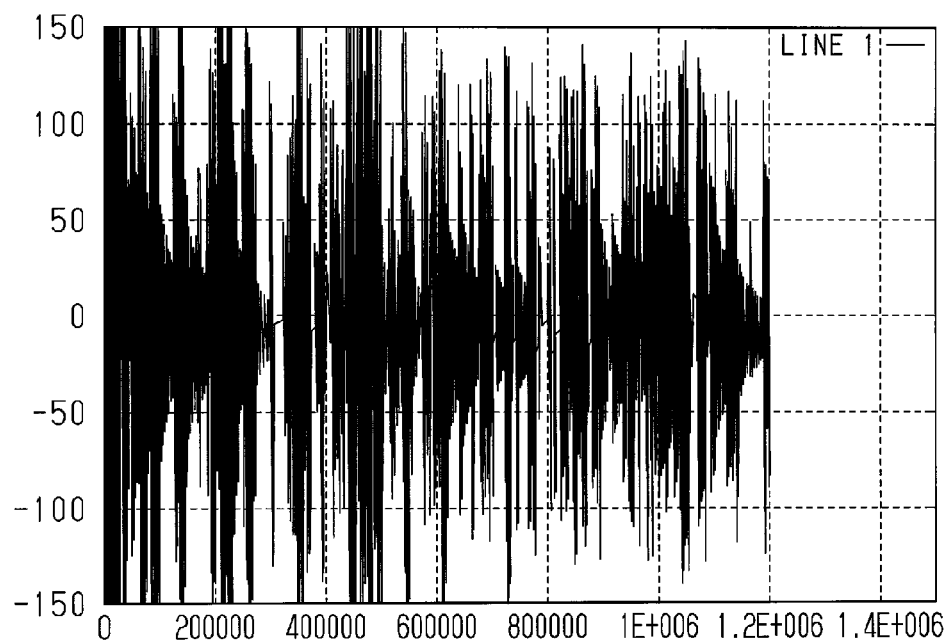
FIG. 3 is a graph of the ratio estimation error without data re-alignment.
Figure 4:
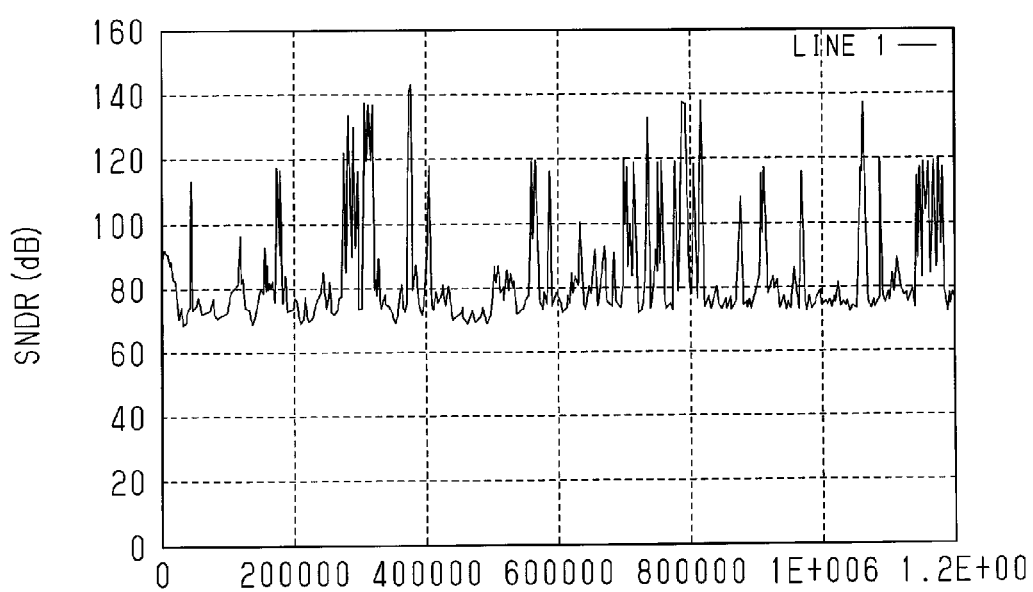
FIG. 4 is a graph of the system SNDR without data re-alignment.

FIG. 3 is a graph of the ratio estimation error without data re-alignment. FIG. 4 is a graph of the system SNDR without data re-alignment. It can be seen that the jitter is very high. The problem reflected by FIGS. 3 and 4 is that without data re-alignment, after about 800000 samples, the final error in the ratio estimation oscillates about the +/−100, and the SNDR value is oscillating in the range of 80 dB-120 dB.

Figure 5A:
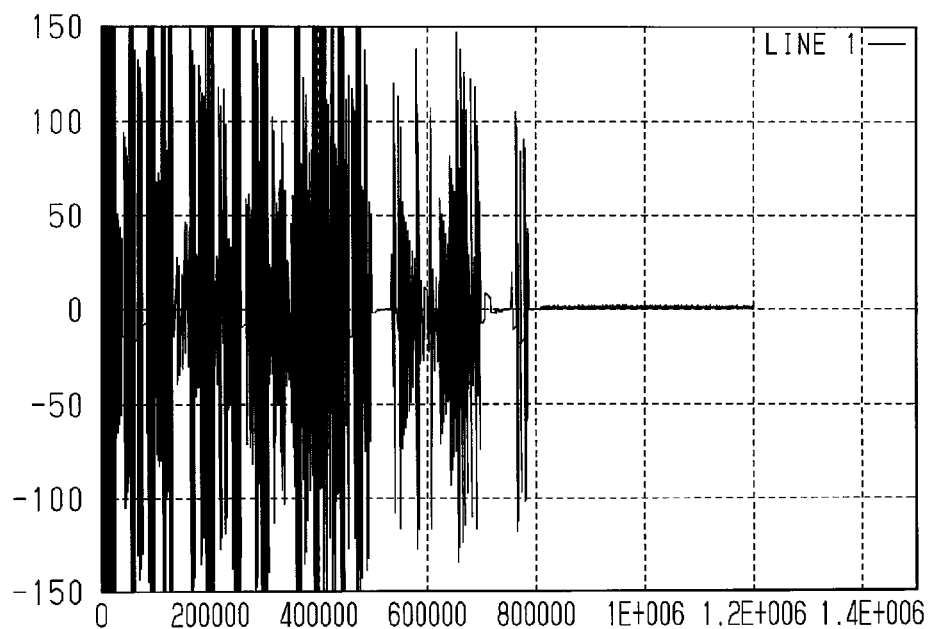
FIG. 5A is graph of the ratio estimation error with data re-alignment according to the present invention.
Figure 5B:
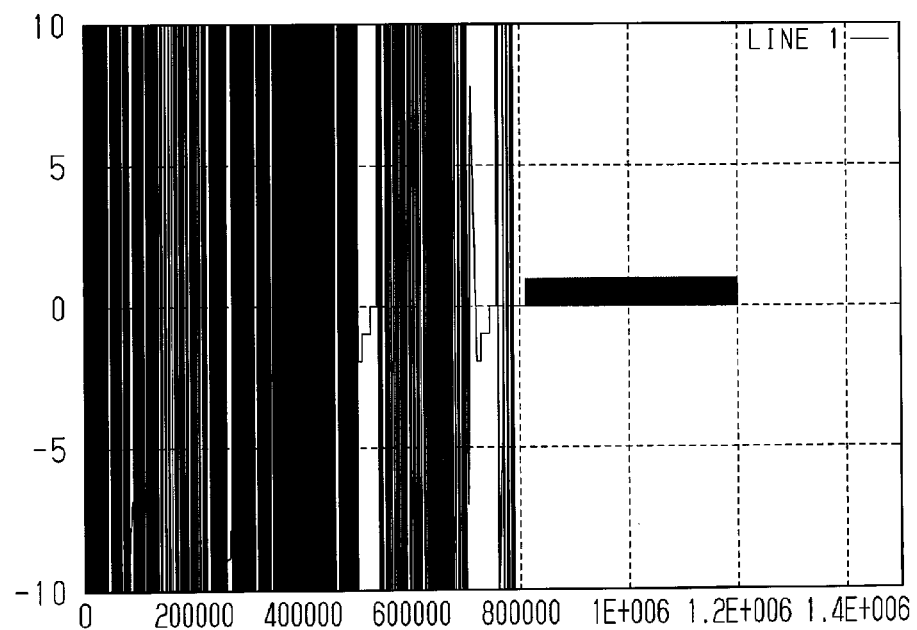
FIG. 5B is a graph with a zoom-in view of FIG. 5A.
Figure 6:
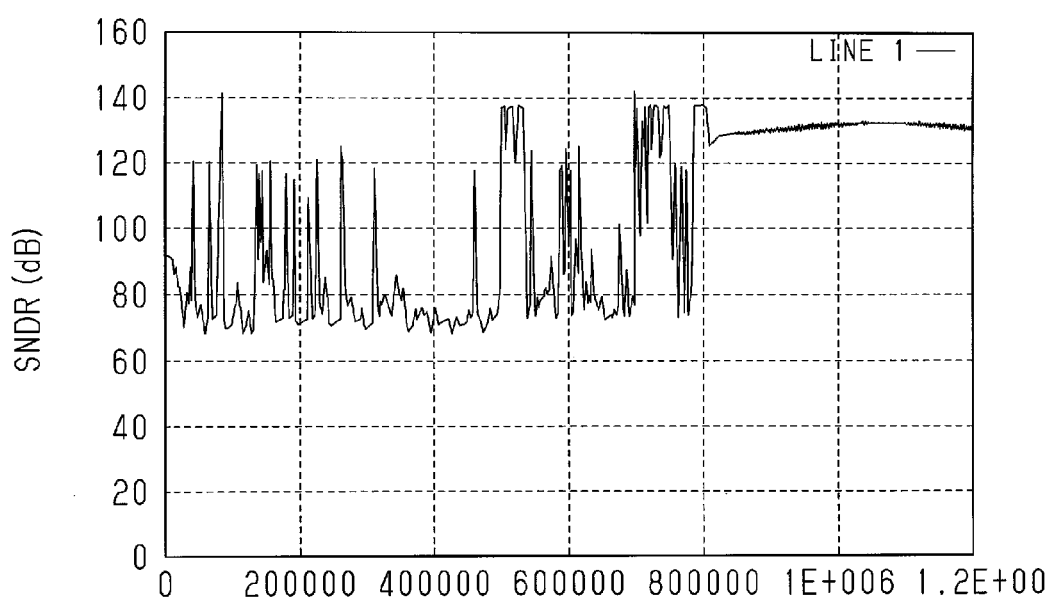
FIG. 6 is a graph of the system SNDR with data re-alignment according to the present invention.

FIG. 5A is graph of the ratio estimation error with data re-alignment according to the present invention. FIG. 5B is a zoom-in view of FIG. 5A. FIG. 6 is a graph of the system SNDR with data re-alignment according to the present invention. As can be seen, the jitter is reduced. It is concluded from FIGS. 5A, 5B and 6 that with data re-alignment, after about 80000 samples, the final error in the ratio estimation oscillates around the +/−1 (this is the smallest error in the fixed-point C simulation), and this SNDR value is stabilized around 130 dB.

Using the above comparison, it can be known that the data re-alignment scheme greatly improves the performance of the system.

Returning now to the DPLL fast searching, it can be seen from the structure in FIG. 2 that the DPLL according to the present invention uses PI (Proportional Brach and Integrator Branch) loop filter. By choosing $K_i=1$ and $K_p=1$, and remaining at these parameters for at least 4 samples, fast searching ability can be supported. The properties of the fast searching schemes are as follows:

1) DPLL uses the Predicted Error Signal (i.e., signal E out of the subtractor 211) to decide whether fast search will start. If the absolute value of the predicted error is too large, DPLL will run fast searching process.

2) If keeping $K_i=1$ and $K_p=1$ all the time, greater jitter will appear at the DPLL output, and will produce bad SNDR value.

3) If the above parameters are not stable for at least 4 samples, the fast searching function is not fully completed, and the fast searching scheme does not work.

4) Fast searching scheme can enable DPLL searching to located the neighborhood of the desired value within 4 samples.

5) After fast searching period is over, DPLL should use smaller $K_i$ and $K_p$ to reduce the influence of jitter which is derived form the quantization error.

FIGS. 7-10 show the simulation results with a comparatively fast searching and without fast searching. In FIGS. 7-10, the X axis stands for the sample number, and Y axis stands for the estimation error from the desired value.

Figure 7:
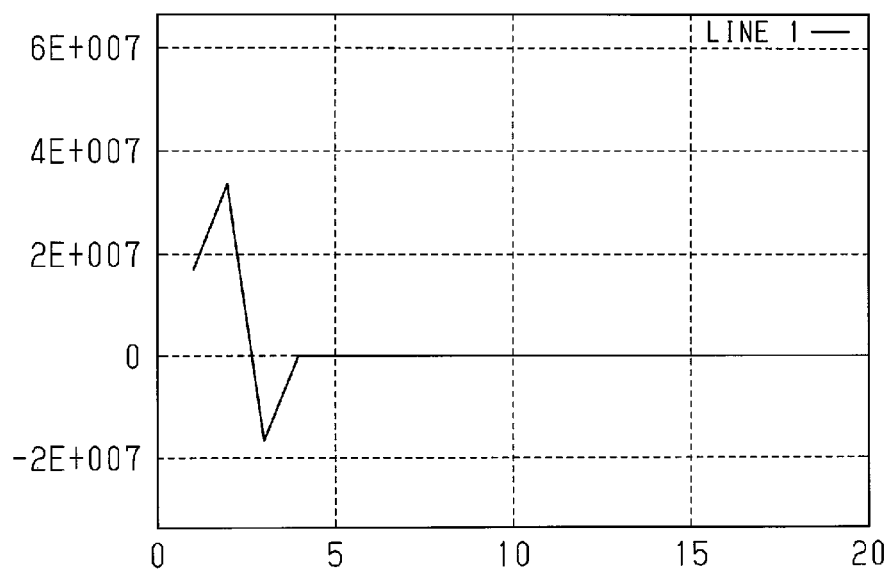
FIG. 7 is a graph of the ratio estimation error of the fast searching.
Figure 8:
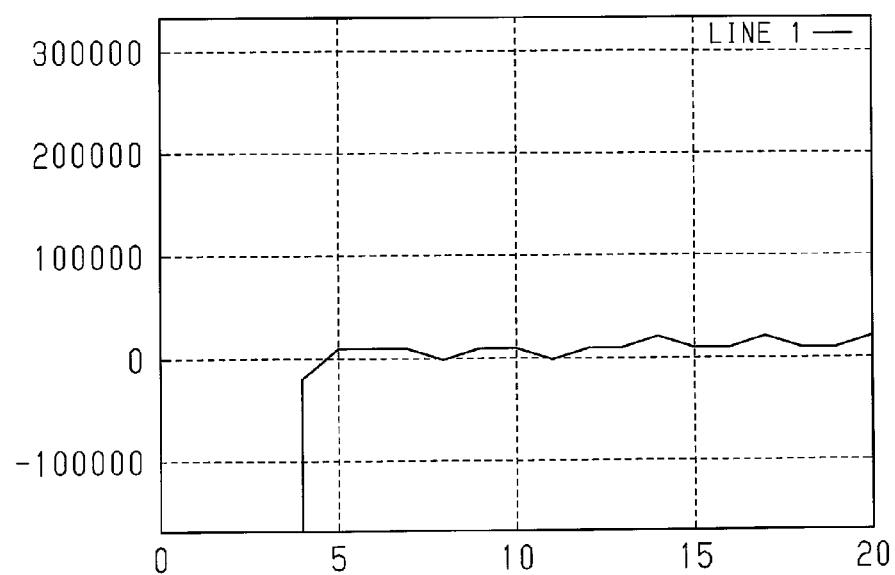
FIG. 8 is a graph with a zoom-in view of FIG. 7.
Figure 9:
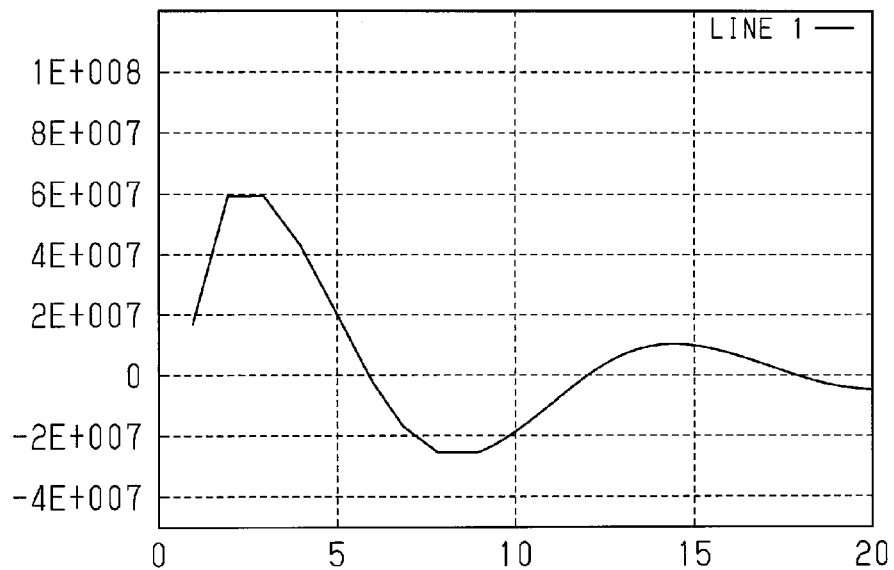
FIG. 9 is a graph of the ratio estimation error without fast searching.
Figure 10:
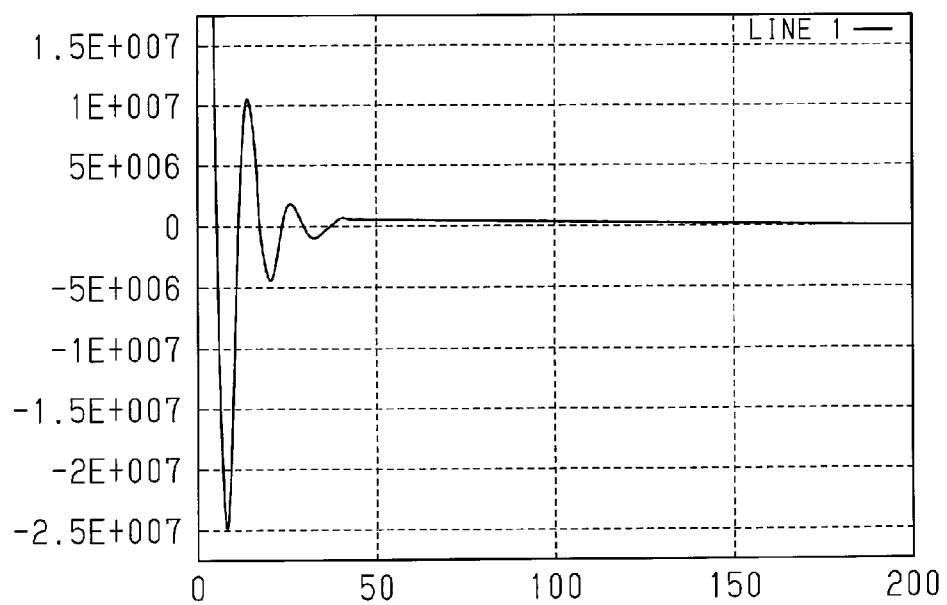
FIG. 10 is a graph with a zoom-in view of FIG. 9.

FIG. 7 is a graph of the ratio estimation error of the fast searching. FIG. 8 is a zoom-in view of FIG. 7. FIG. 9 is a graph of the ratio estimation error without fast searching. FIG. 10 is a zoom-in view of FIG. 9. According to the comparisons of the above figures, the simulation results show that the DPLL can search to the neighborhood of the desired value within 4 samples via the fast searching scheme.

By analyzing the simulation results shown in FIGS. 3-10, the following conclusions can be drawn.

In the present invention, the DPLL structure is modified, and a data re-alignment scheme is proposed as the pre-processing part of the DPLL. By this way, the jitter is reduced, and an almost jitter free estimation of the ratio $Fs_{in}/Fs_{out}$ is got. The system SNDR can reach 120 dB and even greater.

In addition, in the present invention, a fast searching scheme based on the information provided by the pre-processing stage is further proposed. With this fast searching scheme, the second order DPLL can fast search to the neighborhood of the exact value of $Fs_{in}/Fs_{out}$ in almost only 4 samples. That is to say, the technical effects achieved by the present invention include: when the input sampling rate is very near the output sampling rate, by using data re-alignment, the data samples can be re-aligned with a correct timing order, thereby reducing the influence of the quantization error, the jitter is reduced, and the performance is greatly improved. The SNDR reaches 120 dB. The error signal is used to restart the DPLL and activate the fast searching scheme, and the DPLL can fast search to the neighborhood of the exact value. In addition, the system can avoid the problem of the buffer underrun and/or overrun using a fast search.

In addition to the above-mentioned improvements in the system aspect, those skilled in the art should recognize that the present invention actually further provides a method of date re-alignment in a digital phase locked loop (DPLL), the method comprising: generating and processing a first input signal to produce a first processed input signal based on an input clock and an output clock; and generating and processing a second input signal to produce a second processed input signal based on the input clock, the output clock, and a system clock, wherein the second input signal is processed in two branches, and signals resulted from the two branches are re-aligned according to the changed status of the first processed input signal before producing the second processed input signal such that the signals resulted from the two branches are sampled in the same input clock interval.

In the above method, the step of processing a first input signal comprises the step of: a) latching the first input signal based on the input clock when the output clock is asserted. The step of processing a second input signal comprises the steps of: b) the second latch latching the second input signal based on the input clock and the system clock when the output clock is asserted; c) the third latch latching the second input signal when an output enabled (OEN) signal is asserted or the input and the output clock rising edges are taking place in a master clock interval; d) the fourth latch latching an output signal resulted from the third latch when the output clock is asserted; and e) re-aligning an output signal resulted from the second latch with an output signal resulted from the fourth latch according to the changed status of an output signal of the first latch, such that the output signal resulted from the second latch and the output signal resulted from the fourth latch are sampled in the same input clock interval.

The OEN signal is asserted when the output clock is asserted and if no rising edge of the input clock happens at the master clock interval. After step e), performing a division step and a following PLL loop step. The DPLL can be used in an asynchronous sample rate conversion.

According to the present invention, a digital phase locked loop (DPLL) for an asynchronous sample rate conversion (ASRC) device is further provided, the DPLL comprising: a first processing unit that generates and processes a first input signal to produce a first processed input signal based on an input clock and an output clock; and a second processing unit that generates and processes a second input signal to produce a second processed input signal based on the input clock, the output clock, and a system clock, wherein the second processing unit includes two branches for processing said second input signal, and signals resulted from the two branches are re-aligned according to the changed status of the first processed input signal before producing the second processed input signal such that the signals resulted from the two branches are sampled in the same input clock interval.

The first processing unit comprises: a first latch that latches the first input signal based on the input clock when the output clock is asserted. The second processing unit comprises: a second latch that latches the second input signal based on the input clock and the system clock when the output clock is asserted; a third latch that latches the second input signal when an output enabled (OEN) signal is asserted or the input and an output clock rising edges are taking place in a master clock interval; a fourth latch that latches an output signal resulted from the third latch when the output clock is asserted; and means for re-aligning an output signal resulted from the second latch with an output signal resulted from the fourth latch according to the changed status of an output signal resulted from the first latch, such that the output signal resulted from the second latch and the output signal resulted from the fourth latch are sampled in the same input clock interval.

The second processing unit further comprises a fifth latch that generates the OEN signal, wherein the OEN signal is asserted when the output clock is asserted and if no rising edge of the input clock happens at the master clock interval. The second processing unit further comprises: means for performing a division and means for performing a following PLL loop. The DPLL can be used in an asynchronous sample rate conversion.

The present invention further provides a method of controlling in a digital phase locked loop (DPLL), the method comprising: setting and keeping gains of two branches of the control apparatus at a fixed value to enable the DPLL searching to the neighborhood of the desired value; and reducing the gains when a number of samples reaches a predetermined number.

The controlling method further comprises the steps of: subtracting a feedback signal from an input signal to generate a predicted input signal; integrating the predicted signal amplified using the first gain to generate a first integrated signal; summing the first integrated signal and a second integrated signal obtained by amplifying the predicted signal using the second gain to generate a summed signal; and integrating the summed signal when an output clock is asserted to generate the feedback signal, wherein the step of setting and keeping the gains of two branches of the control apparatus at a fixed value comprises: determining whether an absolute value of the predicted input signal is larger than a predetermined threshold, so as to set a first gain and a second gain at the fixed value if the absolute value of the predicted input signal is larger than the predetermined threshold, such that the DPLL can search to the neighborhood of the desired value, and the first and the second gains are reduced when the number of samples reaches the predetermined number.

The fixed value of the gains may be 1, and the predetermined number of samples may be at least 4 samples. The DPLL can be used in an asynchronous sample rate conversion.

In practice, the present invention further comprises a sampling rate conversion apparatus for determining a ratio of input sampling rate to output sampling rate. The sampling rate conversion apparatus includes the DPLL as recited in the present invention, wherein the input clock corresponds to the input sampling rate, the output clock corresponds to the output sampling rate, and in a steady state, the feedback signal is the ratio of input sampling rate to output sampling rate.

The invention claimed is:

1. A control apparatus in a digital phase locked loop (DPLL), comprising:
 a counter that counts a number of samples; and
 a gain controller, in communication with the counter, that sets and maintains gains of two branches of the control apparatus at a fixed value, which enables searching of a desired value by the DPLL to determine a neighborhood of the desired value, and reduces the gains when the number of samples counted in the counter reaches a predetermined number.

2. The control apparatus of claim 1, further comprising:
 a subtractor that subtracts a feedback signal from an input signal to generate a predicted input signal;
 a first gain amplifier that amplifies the predicted input signal with a first gain to generate a first amplified signal;
 a second gain amplifier that amplifies the predicted input signal with a second gain to generate a second amplified signal;
 a first integrator, connected to the first gain amplifier, that integrates the first amplified signal to generate a first integrated signal;
 a summer, connected to the first integrator and the second gain amplifier, that sums the first integrated signal and the second amplified signal to generate a summed signal; and
 a second integrator, connected to the summer, that integrates the summed signal when an output clock is asserted and generates the feedback signal;
 wherein the gain controller determines whether an absolute value of the predicted input signal is larger than a predetermined threshold in order to set the first gain and the second gain at the fixed value if the absolute value of the predicted input signal is larger than the predetermined threshold, to maintain the first and the second gains at the fixed value to enable the DPLL searching to located the neighborhood of the desired value, and to reduce the first and the second gains when the number of samples counted in the counter reaches the predetermined number.

3. The control apparatus of claim 1, wherein the fixed value of the gains is 1.

4. The control apparatus of claim 1, wherein the predetermined number of samples is at least 4 samples.

5. A digital phase locked loop (DPLL) for an asynchronous sample rate conversion (ASRC) device, comprising:
 a first processing unit that generates and processes a first input signal to produce a first processed input signal based on an input clock and an output clock;
 a second processing unit that generates and processes a second input signal to produce a second processed input signal based on the input clock, the output clock, and a system clock;
 a first summer, connected to the first and second processing units, that sums the first and second processed input signals to produce a summed input signal; and
 a closed loop control unit connected to the first summer, wherein the closed loop control unit comprises a counter that counts a number of samples and a gain controller that sets and maintains gains of two branches of the closed loop control unit at a fixed value to enable searching by the DPLL to locate a neighborhood of a desired value, and reduces the gains of the two branches when the counted number of samples reaches a predetermined number.

6. The DPLL of claim 5, further comprising:
 a subtractor, connected to the first summer, that subtracts a feedback signal from the summed input signal to generate a predicted input signal;
 the closed loop control unit further comprising:
  a first gain amplifier, connected to the subtractor, that amplifies the predicted input signal with a first gain to generate a first amplified signal;
  a second gain amplifier, connected to the subtractor, that amplifies the predicted input signal with a second gain to generate a second amplified signal;
  a first integrator, connected to the first gain amplifier, that integrates the first amplified signal to generate a first integrated signal;
  a second summer, connected to the first integrator and the second gain amplifier, that sums the first integrated signal and the second amplified signal to produce a summed amplified signal;
  wherein the gain controller determines whether an absolute value of the predicted input signal is larger than a predetermined threshold, sets the first and second gains at the fixed value if it is determined that the absolute value of the predicted input signal is larger than the predetermined threshold, maintains the first and second gains at the fixed value to enable the DPLL searching to locate the neighborhood of the desired value, and reduces the first and the second gains when the number of samples counted in the counter reaches the predetermined number; and a second integrator, connected to the second summer, that integrates the summed amplified signal when the output clock is asserted to generate the feedback signal.

7. The DPLL of claim 5, wherein the second input signal is processed in two branches of the second processing unit, and signals resulting from the two branches are re-aligned according to a changed status of the first processed input signal before producing the second processed input signal such that the signals resulting from the two branches are sampled in the same input clock interval.

8. The DPLL of claim 7, wherein:
the first processing unit comprises:
a first latch that latches the first input signal based on the input clock when the output clock is asserted;
the second processing unit comprises:
a second latch that latches the second input signal based on the input clock and the system clock when the output clock is asserted;
a third latch that latches the second input signal when an output enabled (OEN) signal is asserted or the input and an output clock rising edges occur in a master clock interval;
a fourth latch that latches an output signal of the third latch when the output clock is asserted;
means for re-aligning an output signal of the second latch with an output signal of the fourth latch according to the changed status of an output signal of the first latch, such that the output signal of the second latch and the output signal of the fourth latch are sampled in the same input clock interval; and
means for performing a division with respect to the re-aligned output signals from the second latch and the fourth latch and outputting the second processed input signal.

9. The DPLL of claim 8, wherein the second processing unit further comprises a fifth latch that generates the OEN signal, wherein the OEN signal is asserted when the output clock is asserted and no rising edge of the input clock occurs at the master clock interval.

10. The DPLL of claim 5, wherein the fixed value of the gains is 1.

11. The DPLL of claim 5, wherein the predetermined number of samples is at least 4 samples.

12. A digital phase locked loop (DPLL) for an asynchronous sample rate conversion (ASRC) device, comprising:
a first processing unit that generates and processes a first input signal to produce a first processed input signal based on an input clock and an output clock;
a second processing unit that generates and processes a second input signal to produce a second processed input signal based on the input clock, the output clock, and a system clock, wherein the second processing unit includes two branches for processing the second input signal, and signals resulting from the two branches are re-aligned according to a changed status of the first processed input signal before producing the second processed input signal such that the signals resulting from the two branches are sampled in the same input clock interval;

a first summer, connected to the first and second processing units, that sums the first and second processed input signals to produce a summed input signal; and
a closed loop control unit having an input including the difference between the summed input signal and a feedback signal generated by the closed loop control unit.

13. The DPLL of claim 12, wherein the closed loop control unit comprises:
a counter that counts a number of samples; and
a gain controller that sets and maintains gains of the two branches of the second processing unit at a fixed value to enable the DPLL searching to located a neighborhood of a desired value, and reduces the gains when the number of samples counted in the counter reaches a predetermined number.

14. The DPLL of claim 13, further comprising:
a subtractor, connected to the first summer, that subtracts a feedback signal from the summed input signal to generate a predicted input signal;
the closed loop control unit further comprising:
a first gain amplifier, connected to the subtractor, that amplifies the predicted input signal with a first gain to generate a first amplified signal;
a second gain amplifier, connected to the subtractor, that amplifies the predicted input signal with a second gain to generate a second amplified signal;
a first integrator, connected to the first gain amplifier, that integrates the first amplified signal to generate a first integrated signal;
a second summer, connected to the first integrator and the second gain amplifier, that sums the first integrated signal and the second amplified signal to produce a summed amplified signal;
wherein the gain controller determines whether an absolute value of the predicted input signal is larger than a predetermined threshold, sets the first and second gains at the fixed value if it is determined that the absolute value of the predicted input signal is larger than the predetermined threshold, maintains the first and second gains at the fixed value to enable the DPLL searching to locate the neighborhood of the desired value, and reduces the first and the second gains when the number of samples counted in the counter reaches the predetermined number; and
a second integrator, connected to the second summer, that integrates the summed amplified signal when the output clock is asserted to generate the feedback signal.

15. The DPLL of claim 13, wherein the fixed value of the gains is 1.

16. The DPLL of claim 13, wherein the predetermined number of samples is at least 4 samples.

17. The DPLL of claim 12, wherein:
the first processing unit comprises:
a first latch that latches the first input signal based on the input clock when the output clock is asserted;
the second processing unit comprises:
a second latch that latches the second input signal based on the input clock and the system clock when the output clock is asserted;
a third latch that latches the second input signal when an output enabled (OEN) signal is asserted or the input and an output clock rising edges occur in a master clock interval;
a fourth latch that latches an output signal of the third latch when the output clock is asserted;
means for re-aligning an output signal of the second latch with an output signal of the fourth latch according to the changed status of an output signal of the first latch, such that the output signal of the second latch and the output signal of the fourth latch are sampled in the same input clock interval; and means for performing a division with respect to the re-aligned output signals from the second latch and the fourth latch and outputting the second processed input signal.

18. The DPLL of claim 17, wherein the second processing unit further comprises a fifth latch that generates the OEN signal, wherein the OEN signal is asserted when the output clock is asserted if no rising edge of the input clock occurs at the master clock interval.

* * * * *